(12) United States Patent
Otsuki et al.

(10) Patent No.: US 6,936,102 B1
(45) Date of Patent: Aug. 30, 2005

(54) SIC MATERIAL, SEMICONDUCTOR PROCESSING EQUIPMENT AND METHOD OF PREPARING SIC MATERIAL THEREFOR

(75) Inventors: Hayashi Otsuki, Nirasaki (JP); Satoru Nogami, Kagawa-Ken (JP)

(73) Assignees: Tokyo Electron Limited, Tokyo-To (JP); Toyo Tanso Co., Ltd., Osaka-Fu (JP)

( * ) Notice: Subject to any disclaimer, the term of this patent is extended or adjusted under 35 U.S.C. 154(b) by 176 days.

(21) Appl. No.: 10/048,622

(22) PCT Filed: Aug. 2, 2000

(86) PCT No.: PCT/JP00/05178

§ 371 (c)(1),
(2), (4) Date: Feb. 4, 2002

(87) PCT Pub. No.: WO01/09407

PCT Pub. Date: Feb. 8, 2001

(30) Foreign Application Priority Data

Aug. 2, 1999 (JP) .................................. 11-218356

(51) Int. Cl.[7] ........................ C30B 25/00; C04B 35/565
(52) U.S. Cl. ........................ 117/84; 117/88; 117/101; 117/951; 501/87; 501/88
(58) Field of Search ........................... 117/84, 88, 101, 117/951; 501/87, 88

(56) References Cited

U.S. PATENT DOCUMENTS

| | | | | |
|---|---|---|---|---|
| 4,912,063 A | * | 3/1990 | Davis et al. .................. 117/97 |
| 5,106,687 A | * | 4/1992 | Tanino et al. ................ 428/141 |
| 5,200,022 A | * | 4/1993 | Kong et al. .................... 117/95 |
| 5,471,946 A | * | 12/1995 | Scholz et al. ................. 117/84 |
| 5,604,151 A | * | 2/1997 | Goela et al. ................. 427/162 |
| 6,063,513 A | * | 5/2000 | Tanino ....................... 428/698 |
| 6,083,812 A | * | 7/2000 | Summerfelt ................ 438/481 |
| 6,153,166 A | * | 11/2000 | Tanino ........................ 423/345 |

FOREIGN PATENT DOCUMENTS

| | | | | |
|---|---|---|---|---|
| EP | 854371 A1 | * | 7/1998 | ............ G02B 1/10 |
| JP | 03126671 A | * | 5/1991 | ........... C04B 35/56 |
| JP | 06191972 A | * | 7/1994 | ........... C04B 41/87 |
| JP | 9-129557 | | 5/1997 | JP |
| 9-246238 | | | 9/1997 | |

(Continued)

OTHER PUBLICATIONS

Patent Abstracts of Japan. English abstract of JP 03-126671 (1989).*

(Continued)

*Primary Examiner*—Nadine G. Norton
*Assistant Examiner*—Matthew Song
(74) *Attorney, Agent, or Firm*—Smith, Gambrell & Russell, LLP

(57) ABSTRACT

A highly corrosion-resistant SiC material is formed on a base body by a CVD process. The SiC material contains β-SiC crystals so oriented that the ratio of the sum of peak intensities of x-ray diffraction for (220) and (311) planes of the β-SiC csystals to the sum of peak intensities of x-ray diffraction for (111), (200), (220), (311) and (222) planes of the β-Sic crystals is 0.15 or above. The SiC material may contain both β-SiC crystals and α-SiC crystals of 6H structure. A base body with a SiC material by a CVD process is used as an internal component member of a semiconductor device fabricating system.

22 Claims, 11 Drawing Sheets

FOREIGN PATENT DOCUMENTS

| | | |
|---|---|---|
| JP | 10-158097 | 6/1998 |
| JP | 2844374 | 10/1998 |
| JP | 2000-160343 | 6/2000 |

OTHER PUBLICATIONS

English Abstract of JP 6-191972A (1994).*

PCT Notification of Transmittal of Copies of Translation of the International Preliminary Examination Report (PCT/IB/338) issued for PCT/JP00/05178.

International Preliminary Examination Report (PCT/IPEA/409) (translated) issued for PCT/JP00/05178.

* cited by examiner

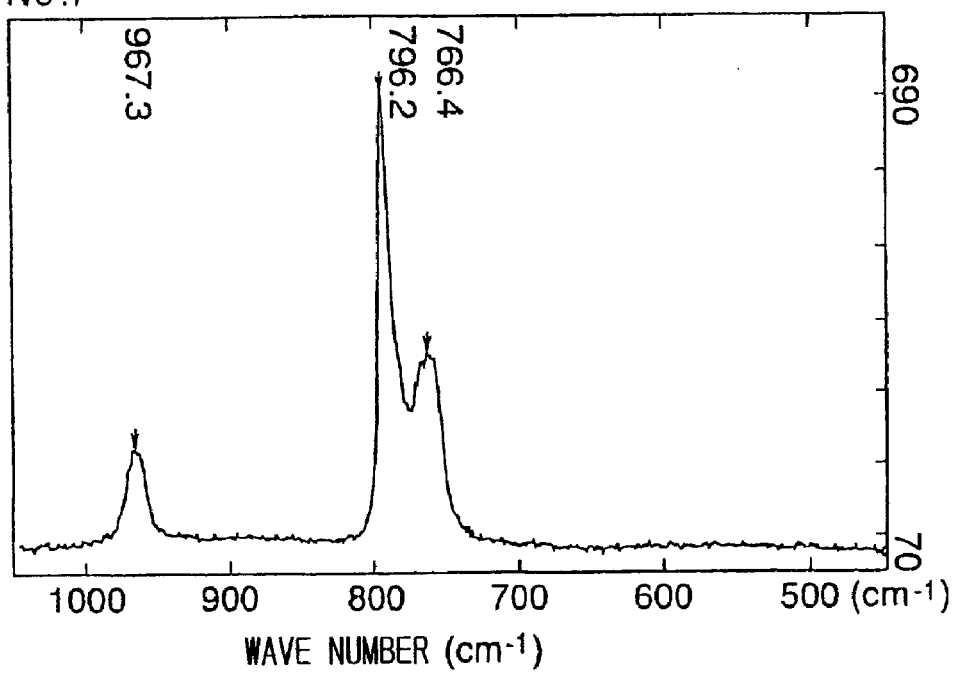
F I G. 6
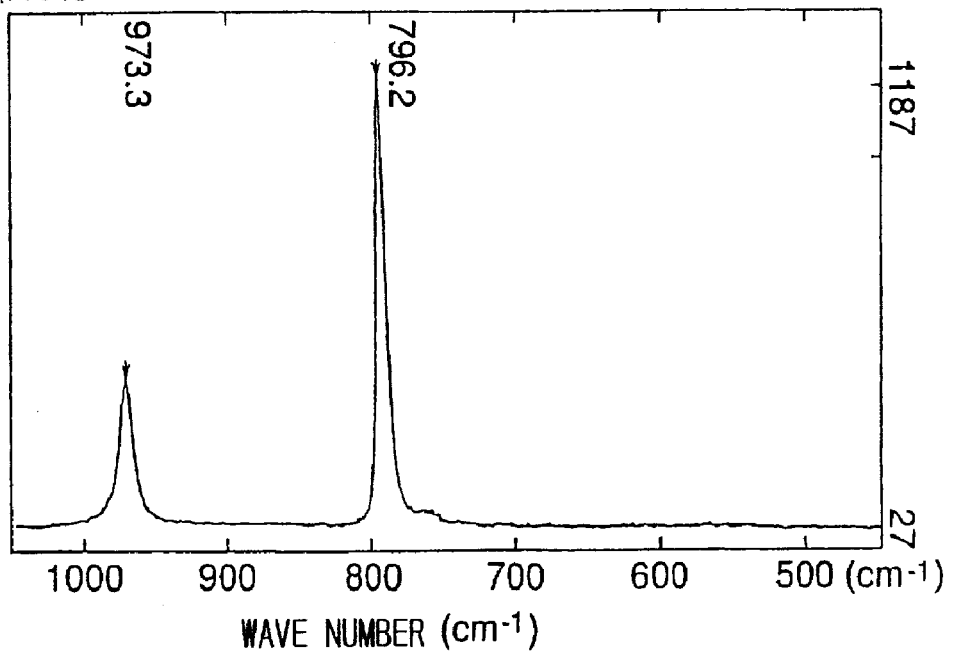
F I G. 7

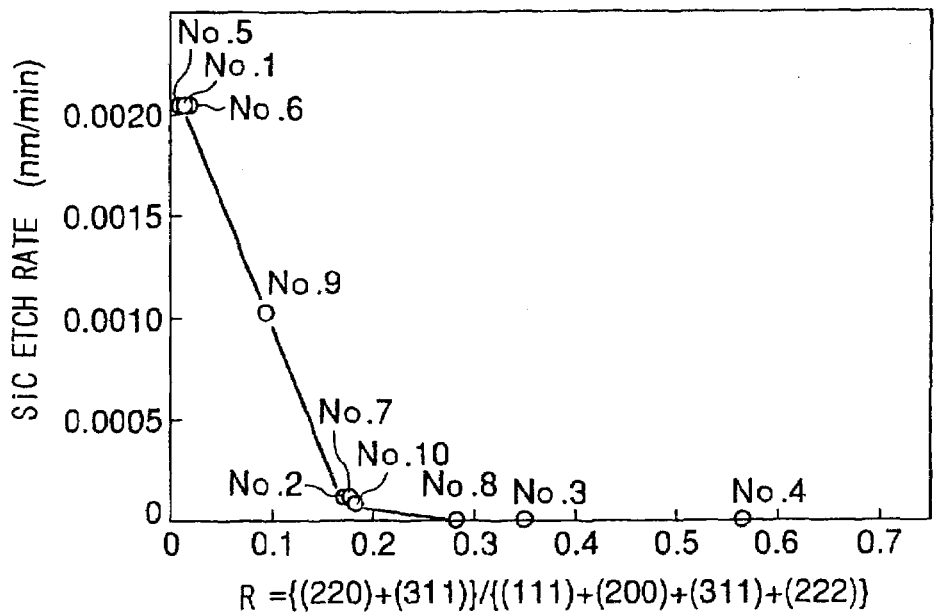
F I G. 8
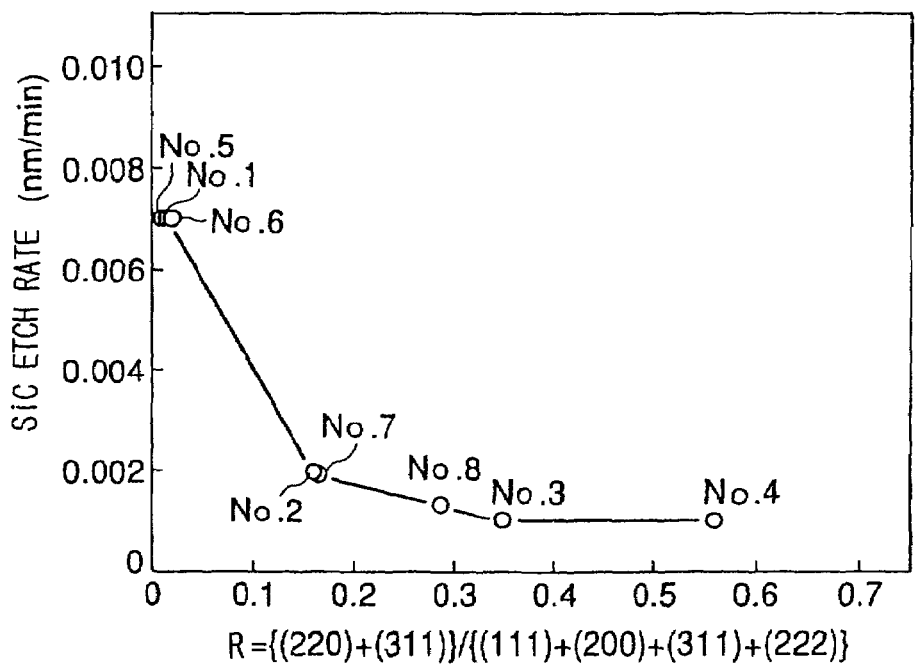
F I G. 9

SIC MATERIAL, SEMICONDUCTOR PROCESSING EQUIPMENT AND METHOD OF PREPARING SIC MATERIAL THEREFOR

TECHNICAL FIELD

The present invention relates to a highly corrosion-resistant SiC material formed by CVD (chemical vapor deposition) (hereinafter referred to as "CVD-SIC material"), a semiconductor device fabricating system employing the CVD-SIC material, and a CVD-SiC material forming method.

BACKGROUND ART

A method of fabricating a semiconductor device includes the steps of forming, for example, a poly-Si layer and a metal layer of a metal, such as Al, W, Cu or such, on a semiconductor wafer. A CVD process is one of processes of forming such layers.

When forming a desired film on a semiconductor wafer by a single-wafer CVD process, the semiconductor wafer is supported on a susceptor placed in a processing chamber. A shield ring is put on the susceptor so as to surround the semiconductor wafer. Prevalently used susceptors and shield rings are those of amorphous carbon or sintered SiC or those formed by coating with a CVD-SIC material.

When depositing a film on a semiconductor wafer by a CVD process in a reaction chamber, the reaction chamber is filled with reactive process gases. Consequently, a film is deposited on parts including the susceptor and the shield ring placed in the reaction chamber as well as on the semiconductor wafer. Thus, the parts placed in the reaction chamber must be cleaned after processing a predetermined semiconductor wafers by a film deposition process.

Generally, the interior of the reaction chamber is cleaned by a wet cleaning method using an acid or alkaline solution. When cleaning the reaction chamber by the wet cleaning method, the film forming system including the reaction chamber must be stopped and the parts must be removed from the reaction chamber. The wet cleaning method takes time and reduces film-forming efficiency. When depositing a film on a semiconductor wafer after removing the parts from the reaction chamber, cleaning the same and returning the same into the reaction chamber, it is possible that impurities adhere to the semiconductor wafer. The impurities adhering to the semiconductor wafer affect adversely to products and reduce the life of the parts.

Recently, an in-situ dry cleaning method using a halogen-containing cleaning gas, such as $ClF_3$ gas, is used to solve problems that may be caused by the wet cleaning method. The dry cleaning method cleans the parts without removing the same from the reaction chamber by supplying a cleaning gas, such as $ClF_3$ gas.

However, during the cleaning of the parts including a susceptor of sintered SiC by the dry cleaning method using $ClF_3$ gas or the like, $ClF_3$ gas etches a sintering agent bonding SiC particles together and, consequently, the particles of SiC separate. Thus, the sintered SiC parts have unsatisfactory corrosion resistance and are practically incompetent. An amorphous carbon part is superior in corrosion resistance to a sintered SiC part. However, amorphous carbon reacts with $ClF_3$ gas, a CF film is deposited on the surfaces of the parts including a shower head and placed in the reaction chamber, and the CF film comes off the surfaces of the parts in particles occasionally. The particles contaminate the semiconductor wafer, reducing the yield rate of the product.

Corrosion resistance of parts including a susceptor formed by coating blanks with a CVD-SiC material is more satisfactory than that of parts of sintered SiC, and the parts formed by coating blanks with a CVD-SiC material do not cause problems that may be caused by parts formed of amorphous carbon. However, the surfaces of the parts formed by coating blanks with a CVD-SiC material are subject to etching and hence the life of those parts is short. The SiC material is easily etched, and the SiC material is liable to be reduced to particles, which reduces the yield rate.

The uniformity of the surface of the conventional CVD-SIC material is not necessarily satisfactory, and a CVD-SIC material having a uniform surface has been desired.

DISCLOSURE OF THE INVENTION

The present invention has been made in view of such circumstances and it is therefore an object of the present invention to provide a CVD-SIC material resistant to the etching action of a halogen-containing gas, such as $ClF_3$ gas, having a uniform surface and having excellent corrosion resistance. Another object of the present invention is to provide a corrosion-resistant article coated with a CVD-SiC material.

The inventors of the present invention made studies to obtain a CVD-SIC material resistant to the etching action of a halogen-containing gas, such as $ClF_3$ gas, and have found that a CVD-SiC material containing β-SiC crystals is more resistant to the corrosive action of a halogen-containing gas, such as $ClF_3$ gas, than the conventional CVD-SiC material. The inventors have found also that a CVD-SIC material of α-SiC crystals of 6H structure and β-SiC crystals is more resistant to the corrosive action of a halogen-containing gas, such as $ClF_3$ gas than the conventional CVD-SiC material. The inventors have found also that those CVD-SiC materials have a highly homogeneous quality.

A highly corrosion-resistant SiC material according to the present invention is formed by a CVD process, contains β-SiC crystals. In the SiC material, the ratio of the sum of the peak intensities of x-ray diffraction for (220) and (311) planes of the β-SiC crystals to the sum of the peak intensities of x-ray diffraction for (111), (200), (220), (311) and (222) planes of the β-SiC crystals is 0.15 or above.

The highly corrosion-resistant SiC material according to the present invention is formed by a CVD process, and contains β-SiC crystals and α-SiC crystals of 6H structure.

The corrosion-resistant SiC material according to the present invention contains α-SiC crystals of 6H structure.

The corrosion-resistant CVD-SiC material according to the present invention is formed on a carbon base body.

The corrosion-resistant CVD-SiC material according to the present invention is formed on a base body of CVR-SiC.

The corrosion-resistant CVD-SiC material according to the present invention is formed on a base body of a ceramic material having a coefficient of thermal expansion differing from that of SiC of the CVD-SiC material by the range of ±2.5×10$^{-6}$/° C.

The corrosion-resistant CVD-SiC material according to the present invention is formed on a base body formed of α-SiC crystals of 6H structure.

A processing system includes a processing vessel for containing a substrate therein, and a processing mechanism for processing the substrate contained in the processing vessel by a predetermined process, wherein parts placed in the processing vessel includes a base body and a corrosion-resistant SiC material containing β-SiC crystals and formed by a CVD process on the base body, and the ratio of the sum of the respective peak intensities of x-ray diffraction for (220) and (311) planes of the β-SiC crystals to the sum of the respective peak intensities of x-ray diffraction for (111), (200), (220), (311) and (222) planes of the β-SiC crystals is 0.15 or above.

A processing system includes a processing vessel for containing a substrate therein, and a processing mechanism for processing the substrate contained in the processing vessel by a predetermined process, wherein parts placed in the processing vessel includes a base body, and a corrosion-resistant coating containing β-SiC crystals and α-SiC crystals of 6H structure and formed by a CVD process.

In the processing system according to the present invention, the SiC material further contains α-SiC crystals of 6H structure.

In the processing system according to the present invention, the base body is formed of SiC or carbon.

In the processing system according to the present invention, the base body is formed of CVR-SiC.

In the processing system according to the present invention, the base body is formed of a ceramic material having a coefficient of thermal expansion differing from that of SiC of the SiC material by the range of $\pm 2.5 \times 10^{-6}/°$ C.

In the processing system according to the present invention, the base body is formed of α-SiC crystals of 6H structure.

In the processing system according to the present invention, the processing mechanism includes a gas supply mechanism and the gas supply mechanism supplies a halogen-containing gas into the processing vessel.

In the processing system according to the present invention, the gas supply mechanism supplies a film-forming gas for depositing a film on a substrate by a CVD process, and a halogen-containing gas as a cleaning gas for cleaning after depositing a film into, the processing vessel.

In the processing system according to the present invention, the gas supply mechanism supplies an etching gas for etching the substrate, into the processing vessel.

In the processing system according to the present invention, the processing mechanism includes a plasma-producing mechanism for producing a plasma in the processing vessel.

The processing system according to the present invention is a LPCVD system, a RTPCVD system, an epitaxial-growth CVD system, an etching system or a coating system.

According to the present invention, a SiC material forming method comprises the steps of: preparing a base body, and depositing a corrosion-resistant SiC material containing β-SiC crystals on the base body by a CVD process by supplying a source gas prepared by mixing a gas containing Si and a gas containing C in an evacuated condition, and heating the base body; wherein the ratio of the sum of peak intensities of x-ray diffraction for (220) and (311) planes of the β-SiC crystals to the sum of peak intensities of x-ray diffraction for (111), (200), (220), (311) and (222) planes of the β-SiC crystals is 0.15 or above.

In the SiC material forming method according to the present invention, a mixed gas prepared by mixing $SiCl_4$ gas containing Si, and $C_3H_8$ containing C is supplied onto the base body.

In the SiC material forming method according to the present invention, the base body is heated at a temperature not lower than 1400° C. in the step of depositing the SiC material.

BRIEF DESCRIPTION OF THE DRAWINGS

FIG. 6 is a Raman spectrum obtained through the measurement of sample No. 7 by Raman spectroscopy;

FIG. 7 is a Raman spectrum obtained through the measurement of sample No. 8 by Raman spectroscopy;

FIG. 8 is a graph showing the dependence of etch rate on R-value after the execution of an actual CVD process and a subsequent in-situ cleaning using $ClF_3$ gas;

FIG. 9 is a graph showing the dependence of etch rate on R-value during a corrosion resistance test in a $ClF_3$ gas atmosphere at 800° C.;

BEST MODE FOR CARRYING OUT THE INVENTION

First Embodiment

Figure 1:
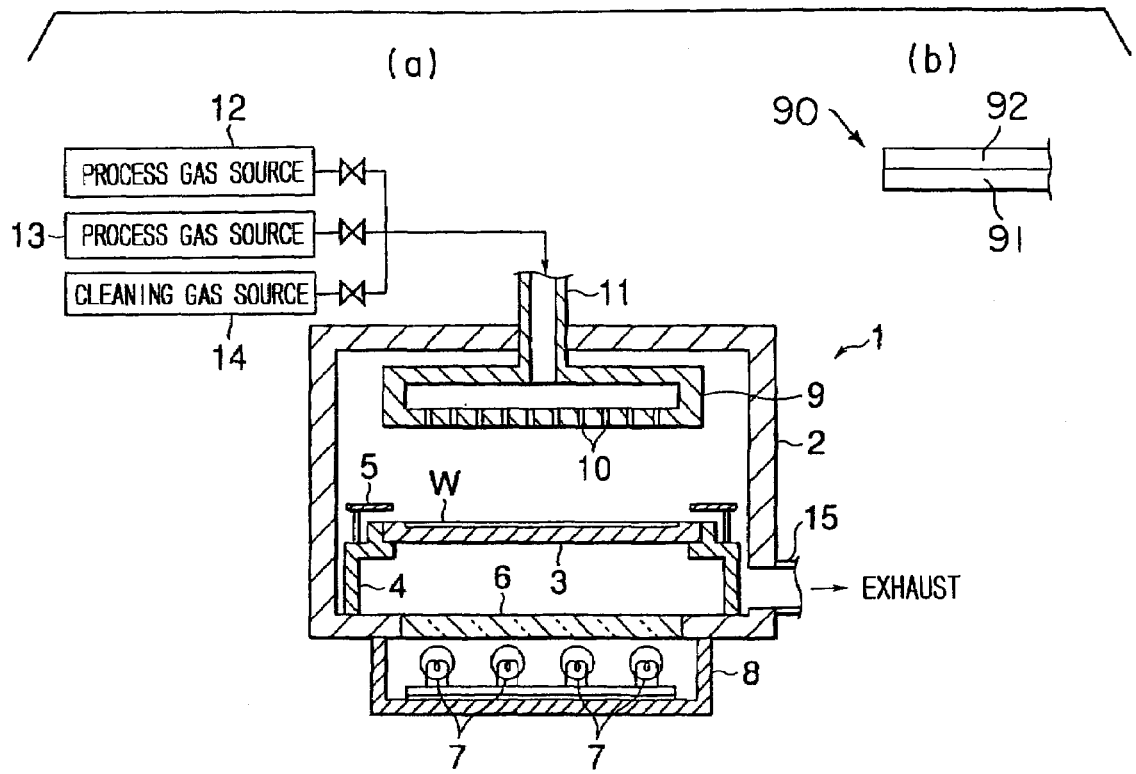
FIG. 1 is a schematic sectional view of a CVD system provided with a part coated with a CVD-SiC material in a first embodiment according to the present invention.

A highly corrosion-resistant SiC material in a first embodiment of the present invention will be described. The SiC material contains β-SiC crystals and is formed by a CVD process (chemical vapor deposition process).

The SiC material formed by the CVD process (hereinafter referred to also as "CVD-SiC material") contains β-SiC crystals oriented such that the ratio of the sum of the respective peak intensities of x-ray diffraction for (220) and (311) planes of the β-SiC crystals to the sum of the respective peak intensities of x-ray diffraction for (111), (200), (220), (311) and (222) planes of the β-Sic crystals is 0.15 or above. SiC crystals are classified largely into α-SiC crystals, i.e., hexagonal crystals, and β-SiC crystals, i.e., cubic crystals. As generally known, β-SiC crystals are more excellent than α-SiC crystals in high-temperature chemical stability. A part, such as a susceptor, formed by coating a base body with a β-Sic material has been employed in a CVD system (semiconductor device fabricating system). The part, such as the susceptor has a base body and a SiC material formed by a CVD process, i.e., CVD-SiC material, formed on the base body. However, the resistance of the conventional CVD-SiC material the corrosive action of halogen-containing gas, such as $ClF_3$ gas is not satisfactory.

Studies were made to develop a CVD-SiC material highly resistant to the corrosive action of a halogen-containing gas, such as $ClF_3$ gas and it was found that increase in the abundance ratio of the (220) and (311) planes in the surface of a β-SiC crystal enhances the resistance of the CVD-SiC material to the corrosive action of the halogen-containing gas, such as $ClF_3$; that is, although the (111) and (222) planes are the principal planes of the conventional β-SiC crystal, the present invention orients a β-Sic crystal such that the abundance ratio of the (220) and (311) planes is 0.15 or above to enhance the corrosion resistance of the CVD-SiC material to the halogen containing gas, such as $ClF_3$ gas. The CVD-SiC material of the present invention does not need to be consisted entirely of such preferable β-SiC crystals.

The present invention discloses crystal orientation by x-ray diffraction. Peak intensities of diffraction for the (111), (200), (220), (311) and (222) planes of the by β-SiC crystals can be detected. The β-SiC crystals are formed such that the ratio of the sum of the respective peak intensities of x-ray diffraction for (220) and (311) planes of the β-SiC crystals to the sum of the respective peak intensities of x-ray diffraction for the (111), (200), (220), (311) and (222) planes of the β-Sic crystals is 0.15 or above.

Possible halogen-containing gases other than $ClF_3$ gas for in-situ cleaning are $ClF_5$, $NF_3$, HCl, $Cl_2$ and HF gases. The CVD-SiC material containing β-Sic crystals of the aforesaid orientation as principal crystals has a sufficiently high corrosion resistance (resistance to etching) to the corrosive action of those halogen-containing gases.

Secondly, the CVD-SiC material contains both α-SiC crystals of 6H structure and β-SiC crystals.

α-SiC crystals are classified into those of 2H, 4H, 6H and 15R structures. An α-SiC crystal of 6H structure is stable at high temperatures. The coexistence of α-SiC crystals of 6H structure and β-SiC crystals in the CVD-SiC material provides the CVD-SiC material with a sufficiently high corrosion resistance to the halogen-containing gas, such as $ClF_3$ gas.

Thirdly, the CVD-SiC material of the present invention contains both β-SiC crystals oriented such that the ratio of peak intensities of x-ray diffraction by the (220) and (311) planes in the surface is 0.15 or above and α-SiC crystals of 6H structure.

Since β-SiC crystals of the aforesaid orientation are, as mentioned above, highly resistant to the corrosive action of a halogen-containing gas, such as $ClF_3$ gas, the coexistence of β-SiC crystals and α-SiC crystals of 6H structure stable at high temperatures provides the CVD-SiC material with a sufficiently high corrosion resistance.

The qualitative homogeneity of the CVD-SiC material of the present invention is higher than that of the conventional CVD-SiC materials.

The base body to be coated with the CVD-SiC material of the present invention may be formed of SiC or carbon. SiC for forming the base body may be SiC produced by converting graphite, sintered Sic or CVD-SiC. SiC obtained by converting graphite is porous CVR-SiC (chemical vapor reaction SiC) produced by the interaction of graphite and silicic acid gas. Sintered SiC is produced by sintering a mixture of SiC powder and a suitable sintering agent at 1600° C. or above. It is generally considered that sintered SiC consists of α-SiC crystals of 6H structure. The base body may be formed of CVD-SiC. Such a base body of CVD-SiC is formed by depositing a Sic film on a graphite plate, and then separating the graphite plate from the SiC film. Graphite and amorphous carbon are possible materials for forming the base body.

Ceramic materials having a coefficient of thermal expansion differing from that of the β-SiC crystals by a difference in the range of $±2.5×10^{-6}/°$ C. are possible materials for forming the base body. Since the coefficient of thermal expansion of the β-SiC crystals is $4.6×10^{-6}/°$ C., ceramic materials having a coefficient of thermal expansion in the range of $2.1×10^{-6}/°$ C. to $7.1×10^{-6}/°$ C. are possible materials for forming the base body. AlN with a coefficient of thermal expansion of $4.6×10^{-6}/°$ C. and BN with a coefficient of thermal expansion of $2.5×10^{-6}/°$ C. are possible ceramic materials.

When depositing the CVD-SiC material on such a base body a gas containing Si, such as $SiCl_4$ gas, and a gas containing C, such as $C_3H_8$ gas, are supplied as source gases to a CVD system and the base body is heated at a predetermined temperature.

The structure of the CVD-SiC material is dependent on the type of the base body, process temperature, source gases and pressure in a furnace. Those factors affecting the structure of the CVD-SiC material are determined properly to obtain a CVD-SiC material of desired structure. The influence of the type of the base body and the process temperature on the structure of the CVD-SiC material is particularly significant.

Preferably, the base body is formed of sintered SiC of α-SiC crystals of 6H structure to form a SiC material consisting of α-SiC crystals of 6H structure and β-SiC crystals. When the base body is formed of such sintered SiC, the α-SiC crystals of 6H structure can be grown at a comparatively low temperature of 1400° C. on the base body.

Preferably, the process temperature of a CVD process is 1450° C. or above for forming a CVD-SiC material containing, as principal components, β-SiC crystals oriented such that the ratio of the sum of the peak intensities of x-ray diffraction for the (220) and (311) planes to that for the (111)(200)(220), (311) and (222) planes is 0.15 or above. The inventors of the present invention have found through experiments that a CVD-SiC material formed on a base body of graphite at a comparatively low process temperature contains β-SiC crystals and α-SiC crystals of 2H structure. Since the α-SiC crystals have low stability at high temperatures and β-SiC crystals are difficult to orient in a desired orientation of the crystals at low temperatures, such a CVD-SiC material is rather inferior in resistance to the corrosive action of a halogen-containing gas, such as $ClF_3$ gas. When the process temperature is about 1500° C. or above, a CVD-SiC material of substantially only β-SiC crystals can be deposited and most β-SiC crystals are oriented in a desired orientation, and hence the CVD-SiC material has a high resistance to the corrosive action of a halogen-containing gas, such as $ClF_3$ gas.

Although the coexistence of α-SiC crystals and β-SiC crystals can be verified by x-ray diffraction, it is not necessarily easy to verify the coexistence of α-SiC crystals and β-SiC crystals accurately by x-ray diffraction because the respective principal peaks of x-ray diffraction by the (111) plane of β-SiC crystals and α-SiC crystals coincide with each other. The coexistence of α-SiC crystals and β-SiC crystals can be accurately verified by Raman spectrometry. As will be apparent from the later description of embodiments, it is preferable that the present invention examines samples by Raman spectrometry for the existence of α-SiC crystals.

Examples of application of the CVD-SiC material excellent in resistance to the corrosive action of a halogen-containing gas will be described hereinafter. FIG. 1 shows a semiconductor device fabricating system, such as a CVD system (chemical vapor deposition system) provided with a member coated with the CVD-SiC material of the present invention in a schematic sectional view.

The CVD system 1 shown in FIG. 1 is intended to deposit a WSi film. The CVD system 1 has a vessel 2 of a metal, such as aluminum defining a processing chamber, and a susceptor 3 placed in the processing chamber to support a semiconductor wafer W (workpiece) on the susceptor. The susceptor 3 is supported on a cylindrical support member 4. A shield ring 5 is supported on the support member 4 so as to cover a peripheral part of the upper surface of the wafer W. The shield ring prevents the deposition of films on lower surfaces including the back surface of the susceptor 3, prevents the upward emission of heat rays emitted by halogen lamps 7, and provides a passage for a cleaning gas during a cleaning process. A transparent window 6 of a material that transmits heat rays, such as quartz, is formed right under the susceptor 3 in the bottom wall of the vessel 2. A heater case 8 holding the halogen lamps 7 therein is disposed under the transparent window 6. Heat rays emitted by the halogen lamps 7 travel through the transparent window 6 and fall on the lower surface of the susceptor 3 to heat the susceptor 3. A showerhead 9 for introducing process gases and a cleaning gas into the chamber is held on the top wall of the vessel 2. The bottom wall of the showerhead 9 is provided with a plurality of gas discharge holes 10, and a gas supply pipe 11 is connected to the top wall of the showerhead 9. Process gas sources 12 and 13 respectively for supplying $WF_6$ gas and $SiH_2Cl_2$ gas, and cleaning gas source 14 for supplying a halogen-containing cleaning gas, such as $ClF_3$ gas, are connected to the gas supply pipe 11. An exhaust opening 15 is formed in the side wall of the vessel 2 at a position near the bottom of the vessel 2. The chamber in the vessel 2 is evacuated through the exhaust opening 15 by a vacuum pump, not shown to maintain the chamber at a vacuum of, for example, 0.7 torr.

Each of the internal component members 90 including the susceptor 3, the shield ring 5 and the shower head 9 of the CVD system 1 is has a base body 91, and a CVD-SiC material (SiC material deposited by a CVD process) 92. Although these component members 90 are exposed to a halogen-containing gas, such as $ClF_3$ gas, these component members 90 are resistant to the corrosive action of the halogen-containing gas. Therefore, when the cleaning gas, such as $ClF_3$ gas, is supplied into the vessel 2 for in-situ cleaning operation after the completion of the film deposition process using the process gases, those component members 90 are hardly etched.

Figure 2:
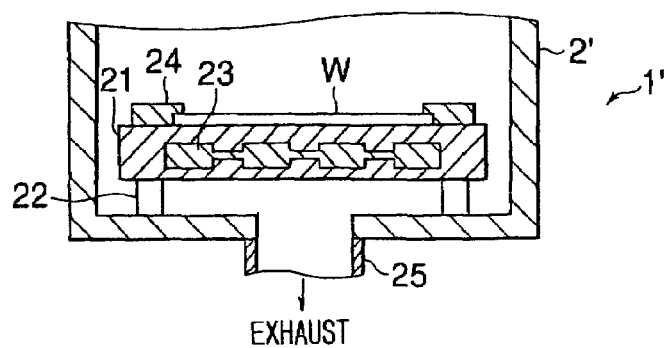
FIG. 2 is a schematic sectional view of another CVD system provided with a member coated with a CVD-SIC material according to the present invention.

FIG. 2 shows a RTPCVD system 1' capable of film deposition and cleaning. The RTPCVD system 1' has a vessel 2', a susceptor 21 supported on a support member 22 and provided with a built-in PG heater (pyrolytic graphite heater) 23, and a clamp ring 24 for fixedly holding a wafer W on the susceptor 21. Each of the internal members 90 including the susceptor 21 and the clamp ring 24 of the RTPCVD system 1' has a base body 91 and a CVD-SiC material 92 coating the base body 91. Thus, the component parts 9 are highly resistant to the corrosive action of a halogen-containing gas, such as $ClF_3$ gas and hence are hardly etched when subjected to a cleaning process.

Figure 3:
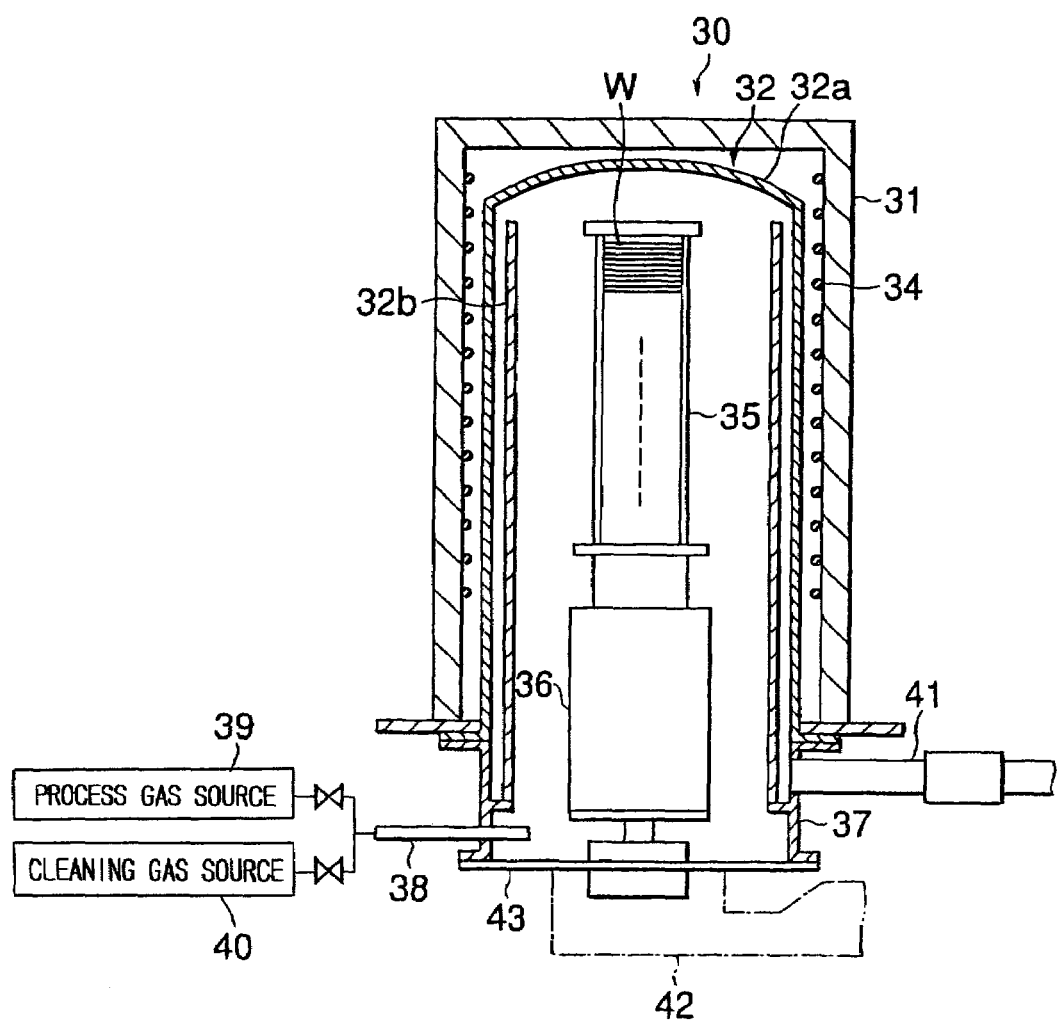
FIG. 3 is a schematic sectional view of third CVD system provided with a member coated with a CVD-SiC material according to the present invention.

The present invention is applicable to component parts of a vertical LPCVD system (low-pressure chemical vapor deposition system) 30 of a batch-processing type capable of in-line cleaning as shown in FIG. 3. Referring to FIG. 3, the vertical LPCVD system 30 includes a vessel 31, a reaction tube 32 consisting of an outer tube 32a and an inner tube 32b, and a heater 32 surrounding the reaction tube 32. The reaction tube 32 is supported on a cylindrical manifold 37. The manifold 37 has an open bottom, which can be covered hermetically with a cap 43. A heat-insulating tube 36 is disposed in the reaction tube 32, and a wafer boat 35 holding a plurality of wafers thereon is mounted on the heat-insulating tube 36. A gas supply pipe 38 for supplying process gases for forming a film, and a cleaning gas, and an exhaust pipe 41 for evacuating the interior of the reaction tube 32 at a predetermined vacuum are connected to the manifold 37. The gas supply pipe 38 is connected to a process gas source 39 for supplying, for example, $SiH_4$ gas, and a cleaning gas source 40 for supplying a halogen-containing cleaning gas, such as $ClF_3$ gas. The wafer boat 35 is carried into and carried out of the reaction tube 32 by about elevator 42.

Each of the internal component members 90 including the wafer boat 35 and the inner tube 32b has a base body 91 and a CVD-SIC material 92 formed on the base body 91. Thus, these component members 90 are resistant to the corrosive action of a halogen-containing gas, such as $ClF_3$ gas. Therefore, when a cleaning gas, such as $ClF_3$ gas, is supplied into the reaction tube 32 for the in-line cleaning of the inside of the reaction tube 32 after the completion of the film deposition process using the process gases, those component members 90 are hardly etched.

EXAMPLES

Examples of the present invention will be described hereinafter.

Base bodies 91 of isotropic graphite of 20 mm×20 mm×3 mm in size were processed in a processing vessel included in a CVD system. $SiCl_4$ gas and $C_3H_8$ gas were used as source gases. The processing vessel was evacuated to a vacuum of 250 torr. The base bodies were hated at 1300° C., 1400° C. and 1500° C., respectively. Thus SiC materials 92 in Examples 1, 2 and 3 were deposited on the surfaces of the base bodies, respectively. A graphite plate of the same size as the base body 91 was heated at 1800° C. in the processing vessel of the CVD system and SiC was deposited on the graphite plate by interaction between sublimated metal Si vapor and carbon dioxide gas to obtain a base body 91. The base body 91 was heated at 1400° C. in the processing vessel evacuated to a vacuum of 250 torr to deposit a SiC material 92 in Example 4 on the base body 91.

Base bodies 91 of isotropic graphite having the same shape for Examples 5, 6 and 8 and a base body 91 of porous, sintered SiC for Example 7 were placed in a processing vessel included in another CVD system, $SiCl_4$ gas and $C_3H_8$, gas as source gases were supplied into the processing vessel to form SiC materials 92 in Examples 5, 6, 7 and 8. In the CVD processes for depositing SiC materials in Examples 5, 6, 7 and 8, the base bodies 91 for Examples 5, 6, 7 and 8 were heated at 1300° C, 1400° C., 1400° C. and 1500° C., respectively.

Base bodies 91 of isotropic graphite having the same shape were placed in a processing vessel included in a third CVD system, $SiCl_4$ gas and $C_3H_8$ gas as source gases were supplied into the processing vessel and the base bodies 91 were hated at 1400° C. to deposit SiC materials 92 in Examples 9 and 10 on the base bodies, respectively.

X-rays were passed through the SiC materials 92 in Examples 1 to 10 for the x-ray diffraction analysis of the surfaces of the SiC materials 92 in Examples 1 to 10. Peak intensities of x-ray diffraction by the (111), (200), (220), (311) and (222) planes of β-Sic crystals grown in the SiC materials 92 were measured, and the ratio R expressed by the following expression was calculated.

$$R=\{(220)+(311)\}/\{(111)+(200)+(220)+(311)+(222)\}$$

Values of the ratio R for the SiC materials 92 in Examples 1 to 10 were 0.004, 0.168, 0.349, 0.561, 0.002, 0.005, 0.17, 0.286, 0.095 and 0.178, respectively.

Figure 4:
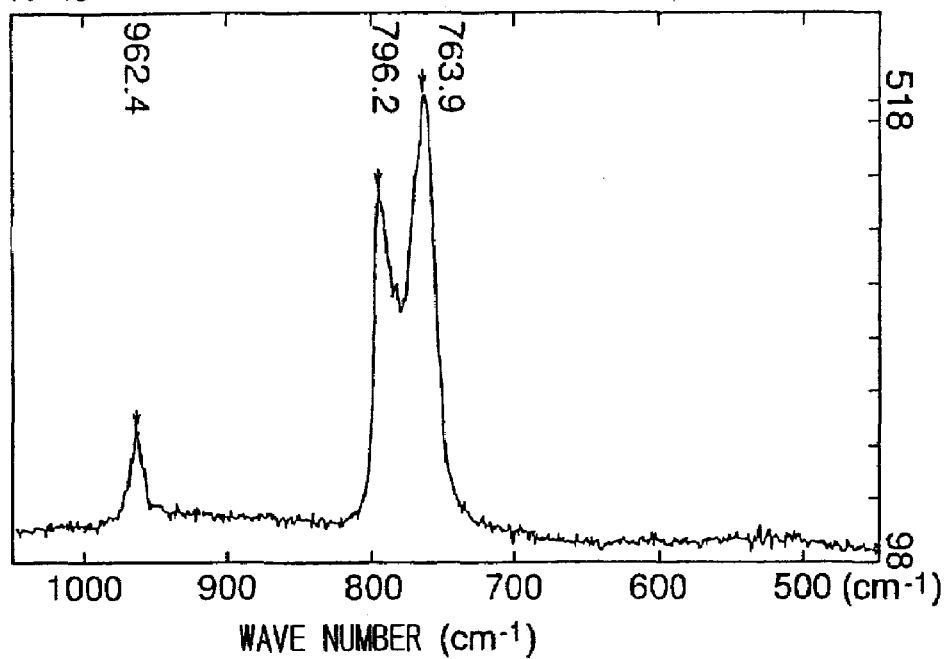
FIG. 4 is a Raman spectrum obtained through the measurement of sample No. 5 by Raman spectroscopy.
Figure 5:
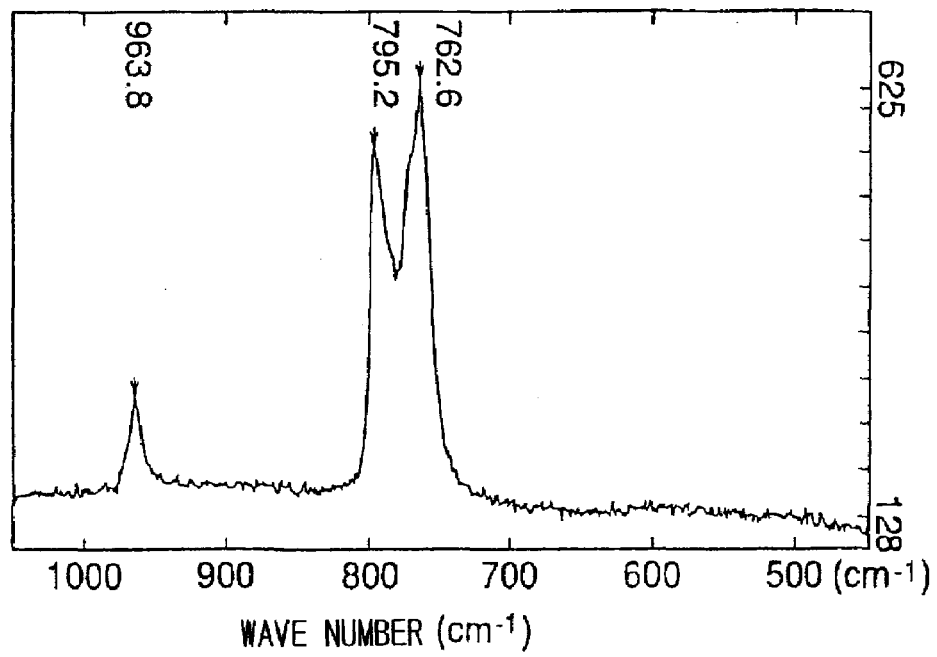
FIG. 5 is a Raman spectrum obtained through the measurement of sample No. 6 by Raman spectroscopy.

The SiC materials in Examples 5 to 8 were examined by Raman spectroscopy. Raman spectra shown in FIGS. 4 to 7 for the Sic materials in Examples 5 to 8 were obtained. Each of the Raman spectra shown in FIGS. 4 and 5 corresponding to the SiC materials in Examples 5 and 6 respectively has peaks at a wave number of about 795 cm$^{-1}$ corresponding to β-SiC crystals and a wave number in the range of 762 to 763 cm$^{-1}$ corresponding to α-SiC crystals of 2H structure. It is known from FIGS. 4 and 5 that the SiC materials in Examples 5 and 6 contain both β-SiC crystals and α-SiC crystals of 2H structure.

The Raman spectrum shown in FIG. 6 for the SiC material in Example 7 formed on the base body of porous, sintered SiC base body has peaks at a wave number of about 795 cm$^{-1}$ corresponding to β-SiC crystals and a wave number in the range of 766 to 768 cm$^{-1}$ corresponding to α-SiC crystals of 6H structure. It is known from FIG. 6 that the SiC material in Example 7 contain both β-SiC crystals and α-SiC crystals of 6H structure.

AS shown in FIG. 7, the SiC material in Example 8 has a peak at a wave number of about 795 cm$^{-1}$ corresponding to β-sic crystals and does not have any peak corresponding to α-SiC crystals.

The SiC materials in Examples 1 to 10 were subjected to a corrosion resistance test, in which the Sic materials were subjected to an actual CVD process and to a subsequent in-situ cleaning process using ClF$_3$ gas in a CVD system, and etch rates at which the SiC materials were etched by the cleaning process were measured. In the CVD process, a silicon substrate was supported on the SiC material in each Example (Example 1 to 10), and a 4 μm thick WSi film was deposited on the silicon substrate in a CVD atmosphere of 575° C. and 0.7 torr. In the cleaning process, each SiC material was subjected to forty cleaning cycles (200 min). In each cleaning cycle, the base body coated with the SiC material serving as a susceptor was heated at 200° C. and ClF$_3$ gas was supplied for five minutes. FIG. 8 shows the relation between R-value and etch rate.

The SiC materials in Examples 1 and 9 having R-values smaller than 0.15 were etched at high etch rates of 0.0021 μm/min and 0.00105 μm/min, respectively. The Sic materials in Examples 2 and 10 respectively having R-values of 0.168 and 0.178 were etched at low etch rates of 0.00015 μm/min and 0.000081 μm/min, respectively. The SiC materials in Examples, 3, and 4 were etched scarcely.

The SiC materials in Examples 5 and 6 each consisting of β-SiC crystals and α-SiC crystals of 2H structure had small R-values and were etched at high etch rates. Thus, the SiC materials in Examples 5 and 6 were unsatisfactory in corrosion resistance. The SiC material in Example 7 consisting of β-SiC crystals and α-SiC crystals of 6H structure had R-value of 0.17 and was etched at a low etch rate of 0.00013 μm/min. Although the Sic materials in Example 6 and 7 were formed at the same film forming temperature of 1400° C., the Sic material in Example 7 consisting of β-SiC crystals and α-SiC crystals of 6H structure, which is inferred that the base body coated with the SiC material in Example 7 was formed by sintering SiC powder at a high sintering temperature and hence had α-SiC crystals of 6H structure and, therefore, the SiC crystals grown on the base body were α-SiC crystals of 6H structure. It was found that the SiC material consisting of both β-SIC crystals and α-SiC crystals of 6H structure has high etch resistance regardless of the R-value. The SiC material in Example 8 had a large R-value of 0.286 and was etched scarcely. Thus, the test results showed the SiC materials meeting conditions specified by the present invention exercise very high corrosion resistance during the in-situ cleaning process using ClF$_3$ gas.

The SiC materials in Examples 1 to 8 were kept in a ClF$_3$ gas atmosphere of 800° C. for 60 min and etch rates at which the SiC materials were etched were calculated. FIG. 9 shows the relation between R-value and etch rate. Although etch rates shown in FIG. 9 are different from those shown in FIG. 8, the relation between R-value and etch rate shown in FIG. 9 is similar to that shown in FIG. 8.

The SiC in Example 1 having a small R-value of 0.15 was etched at a high etch rate of about 0.007. The SiC materials in Examples 2, 3 and 4 having R-values not smaller than 0.15 were etched at low etch rates of 0.0020 μm/min, 0.0010 μm/min and 0.0010 μm/min, respectively, which were lower than 0.002 μm/min.

The SiC materials in Examples 5 and 6 consisting of β-SIC crystals and α-SiC crystals of 2H structure and having small R-values were etched at high etch rates, respectively, and had poor corrosion resistance. The SiC material in Example 7 consisting of β-SIC crystals and α-SiC crystals of 6H structure and having an R-value of 0.17 was etched at a low etch rate of 0.0018 μm/min and was satisfactory in etch resistance. The SiC material in Example 8 consisting of only β-SiC crystals and having a large R-value of 0.286 was etched at a low etch rate of 0.0013 μm/min.

Figure 10:
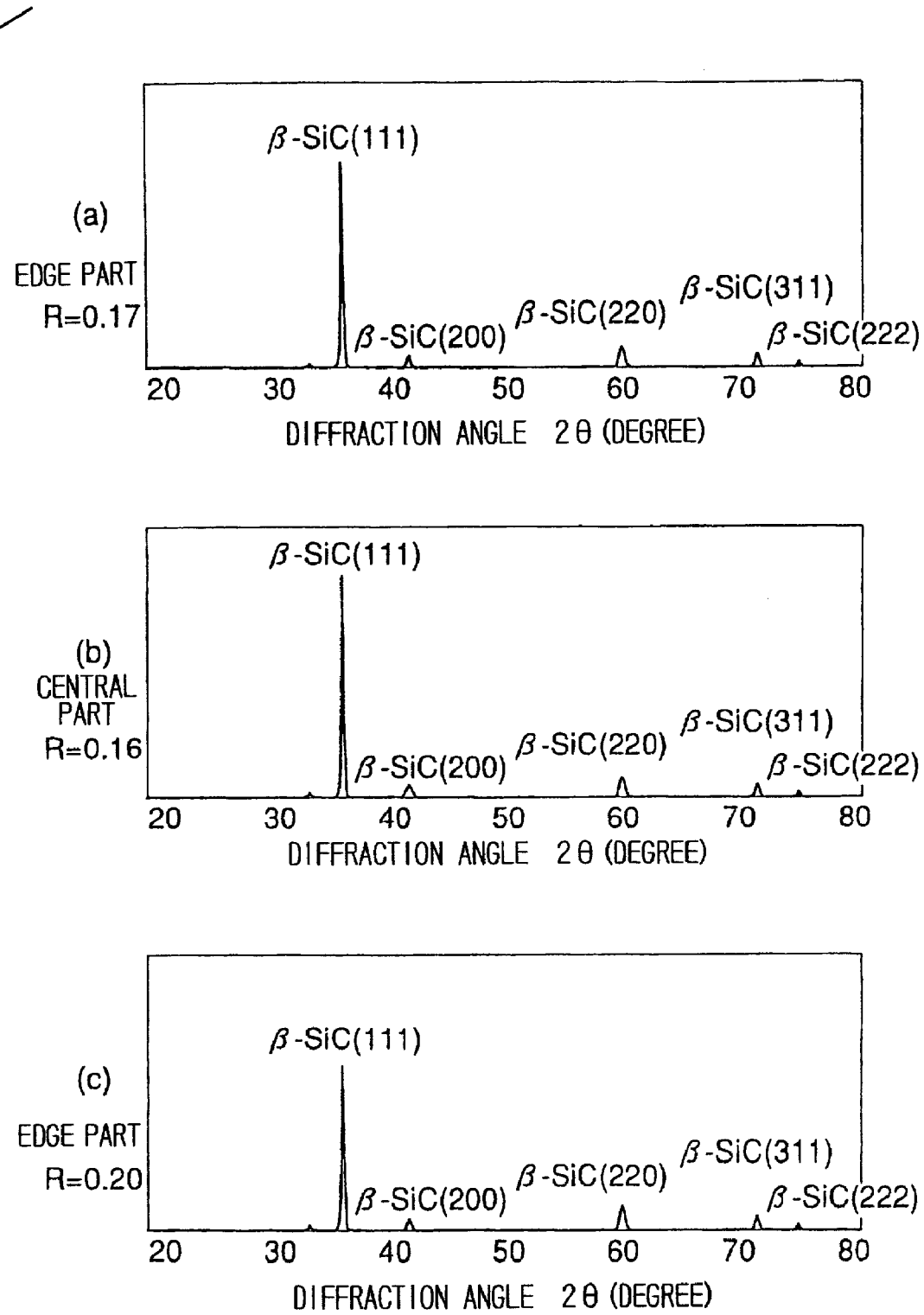
FIGS. 10(a), 10(b) and 10(c) are x-ray diffraction diagrams obtained by the x-ray diffraction analysis of opposite edge parts and a central part of a CVD-SiC material.

A base body of isotropic graphite of 340 mm in diameter and 8 mm in thickness was processed in a processing vessel included in a CVD system to form a susceptor. SiCl$_4$ gas and C$_3$H$_8$ gas were used as source gases, and the base body was hated at 1400° C. to deposit a SiC material on the surface of the base body. Qualities of opposite edge parts and a central part of the SiC material were analyzed by x-ray diffraction analysis to determine the crystalline homogeneity of the SiC material. Results of the x-ray diffraction analysis of the SiC material are shown in FIG. 10. As obvious from FIG. 10, peaks of x-ray diffraction by the edge parts and the central part are substantially the same, and one of the edge parts, the central part and the other edge part have R-values of 0.17, 0.16 and 0.20, which are not greatly different form each other. The x-ray diffraction analysis of the SiC material verified that the SiC material has a homogeneous crystalline quality. The difference in thickness between the edge parts and the central parts was little and the SiC material was excellent in the uniformity of thickness.

As apparent from the foregoing description, the CVD-SiC material according to the present invention is resistant to the etching action of a halogen-containing gas, such as ClF$_3$ gas, has a homogeneous surface and is excellent in corrosion resistance. A corrosion-resistant part excellently resistant to the corrosive action of a halogen-containing gas can be formed by coating a base body with the CVD-SIC material of the present invention.

Second Embodiment

A second embodiment of the present invention will be described with reference to FIGS. 11 to 15. FIGS. 11 to 15 show different semiconductor device fabricating systems each provided with internal component parts analogous to the internal component member 90 formed by coating the base body 91 with the CVD-SiC material 92 in the first embodiment of the present invention. The internal component member 90 consisting of the base body 91 and the SiC material 92 can be used not only in the CVD system mentioned in the description of the first embodiment, but also in other CVD systems, such as a plasma CVD system.

Naturally, the internal component member 90 consisting of the base body 91 and the SiC material 92 is applicable to not only a CVD system using a halogen-containing gas as a cleaning gas, but also a dry-etching system using a halogen-containing gas as a process gas.

Figure 11:
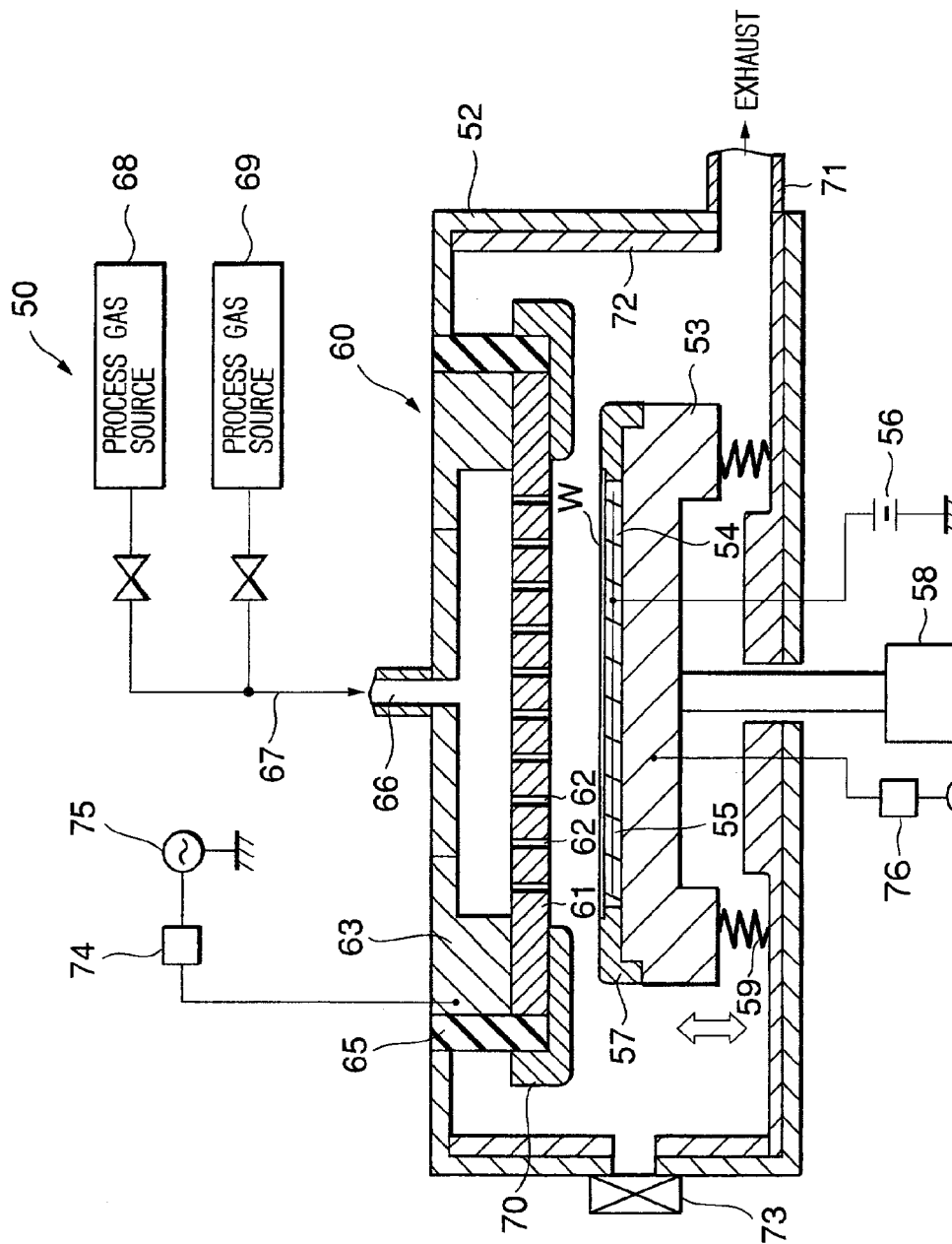
FIG. 11 is a schematic sectional view of a plasma etching system in a second embodiment according to the present invention.

An etching system provided with an internal component member coated with the CVD-SiC material of the present invention will be described. FIG. 11 shows a plasma etching system 50 employing members coated with the CVD-SiC material of the present invention in a schematic sectional view. The plasma etching system 50 is a capacitive diode parallel-plates etching system provided with parallel electrode plates placed one above the other. One of the electrode plate is connected to a plasma-producing power supply.

The plasma etching system 50 has a cylindrical processing vessel 52 of aluminum defining a processing chamber. A substantially cylindrical susceptor 53 for supporting a wafer W thereon is placed in a bottom region of the processing chamber in the processing vessel 52. A refrigerant passage, not shown, is formed in the susceptor 53. A refrigerant, such as liquid nitrogen, is passed through the refrigerant passage to cool the wafer W through the susceptor 53. The susceptor 53 serves as a lower electrode.

The susceptor 53 has an upwardly protruding, round central part and an electrostatic chuck 54 having a shape substantially the same as the wafer W is mounted on the central part of the susceptor 53. The electrostatic chuck 54 is formed by sandwiching an electrode 55 between insulating plates. A dc power supply 56 applies a dc voltage of, for example, 1.5 kV to the electrode 55 to electrostatically attract the wafer W to the electrostatic chuck 54 by, for example, Coulomb force. An annular focus ring 57 is disposed on a peripheral part of the upper surface of the susceptor 53 so as to surround the wafer W placed on the electrostatic chuck 54. The focus ring 57 improves etching uniformity. The susceptor 53 can be vertically moved by an elevating mechanism 58. Driving parts disposed under a central part of the susceptor 53 are covered with a bellows 59 to isolate evacuated parts from the atmosphere.

An upper electrode 60 is disposed above the susceptor 53 opposite to and in parallel to the susceptor 53. The upper electrode 60 is supported by an upper region of the processing chamber 52 through an insulating member 65 in the processing vessel 52. The upper electrode 60 has an electrode plate 61 facing the susceptor 53 and provided with a plurality of gas discharge holes 62, and an electrode holder 63 holding the electrode plate 61. The electrode folder 63 is formed of, for example, aluminum, and has an anodized surface. A peripheral part of the lower surface of the electrode plate 61 is covered with a shield ring 70. The electrode holder 63 is provided with a gas inlet 66, and a gas supply pipe 67 is connected to the gas inlet 66. A first process gas source 68 for supplying a halogen-containing gas, such as $CF_4$ gas, as an etching gas, and a second process gas source 69 for supplying a gas, such as $O_2$ gas, as another etching gas are connected to the gas supply pipe 67. Process gases flow through the gas supply pipe 67 and the gas inlet 66 into the electrode holder 63 and are discharged through the gas discharge holes 62 of the electrode plate 61 into the processing chamber in the processing vessel 52. An exhaust opening 71 is formed in a bottom part of the processing vessel 52 to maintain the processing chamber at a predetermined vacuum by evacuating the processing vessel 52 by a vacuum pump, not shown, connected to the exhaust opening 71. A deposition shield 72 is detachably fitted in the processing vessel so as to cover the inner surface of the side wall of the processing vessel 52 to prevent byproducts from depositing on the inner surface of the processing vessel 52. A gate valve 73 is attached to the side wall of the processing vessel 52. The gate valve 73 is opened to carry a wafer W into and to carry the same out of the processing vessel 52.

The upper electrode 60 is connected through a matching circuit 74 to a first high-frequency power supply 75 for producing a plasma. The first high-frequency power supply 75 supplies high-frequency power of, for example, 60 MHz to produce a plasma in the processing vessel 52. The susceptor 53 serving as a lower electrode is connected through a matching circuit 76 to an ion-pulling second high-frequency power supply 77. The second high-frequency power supply 77 supplies high-frequency power of, for example, 2 MHz to the susceptor 53 to pull ions toward the wafer W during an etching process.

In this plasma etching system 50, the susceptor 53, the focus ring 57, the electrode plate 61 of the upper electrode 60, the shield ring 70 and the deposition shield ring 72 disposed in the processing vessel 52 are internal component members formed by coating base bodies with the CVD-SiC material of the present invention.

When the plasma etching system 50 is used for an etching process, a wafer W is carried into the processing vessel 52, the wafer W is placed on and attracted by the electrostatic chuck 54, the processing chamber in the processing vessel 52 is maintained at a predetermined vacuum, the process gases are supplied into the processing vessel, and high-frequency power is supplied to the upper electrode 60 to produce a plasma in the processing vessel 52 to etch a film formed on the wafer W. Since the foregoing internal component members in the processing vessel 52 are coated with the CVD-SiC material of the present invention, the internal component members are highly resistant to the corrosive action of the halogen-containing gas used as the process gas for etching.

Thus, the CVD-SiC material of the present invention is highly resistant to the corrosive action of the halogen-containing gas and exercises great effect in preventing the corrosion of the internal component members used in an atmosphere of a halogen-containing gas. The CVD-SIC material is intrinsically excellent in heat conductivity, thermal shock resistance and surface smoothness. The CVD-SiC material having such excellent properties can be effectively used under various conditions other than the atmosphere of a halogen-containing gas.

Figure 12:
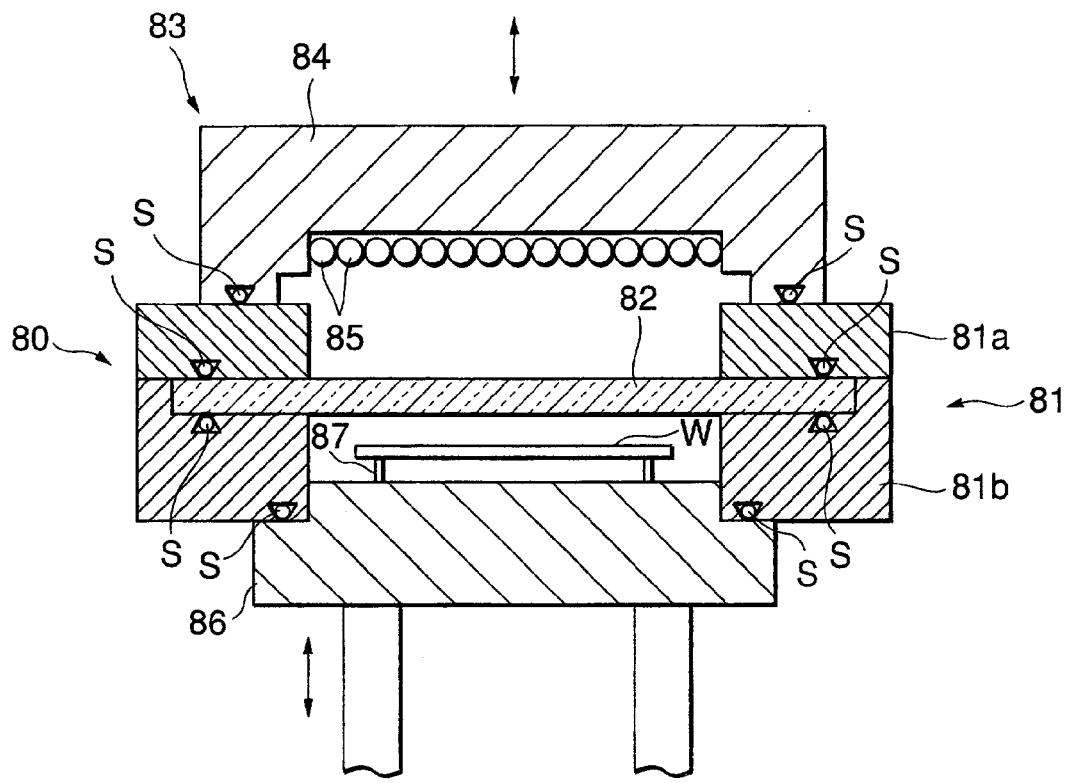
FIG. 12 is a schematic sectional view of a RTP system.

Some examples of uses of the CVD-SiC material of the present invention will be described hereinafter. FIG. 12 shows a RTP system (rapid thermal processing system) 80 provided with a member coated with the CVD-SiC material of the present invention in a schematic sectional view. The RTP system 80 is used for annealing a semiconductor material doped with an impurity. Referring to FIG. 12, the RTP system 80 has a processing vessel 81 defining a processing chamber. The processing vessel 81 can be divided into an upper vessel 81a and a lower vessel 81b. A quartz window 82 is interposed between the upper vessel 81a and the lower vessel 81b. A heating device 83 is separably joined to the upper end of the processing vessel 81. The heating device 83 has a water jacket 84, and a plurality of tungsten lamps 85 arranged on the lower surface of the water jacket 84. A water-cooled platen 86 for supporting a semiconductor wafer W thereon is joined separably to the lower end of the processing vessel 81. Support pins 87 are set upright on the upper surface of the platen 86 to support a wafer W. Sealing members S are held between the water jacket 84 of the heating device 83 and the upper vessel 81a, between the upper vessel 81a and the quartz window 82, between the quartz window 82 and the lower vessel 81b, and between the lower vessel 81b and the platen 86, respectively, to seal hermetically the processing chamber in the processing vessel 81. The processing vessel 81 can be evacuated by an evacuating system, not shown.

In this RTP system, i.e., a heat-treatment system, a wafer W is supported on the support pins 87 in the processing vessel 81, the processing vessel 81 is sealed, and the processing vessel 81 is evacuated to a vacuum by the evacuating system. Subsequently, the tungsten lamps 85 of the heating device 83 are turned on. Heat emitted by the tungsten lamps 85 is transmitted through the quartz window 82 to heat the wafer W rapidly. After properly heating the wafer W, the processing vessel 81 is opened to the atmosphere, the heating device 83 is retracted, and the platen 86 is lowered to cool the wafer W rapidly. Thus, a rapid thermal process is achieved.

The inner surface of the platen 86 is coated with the CVD-SIC material of the present invention. As mentioned above, the CVD-SiC material of the present invention is highly resistant to the corrosive action of a halogen-containing gas, is qualitatively homogeneous and has a uniform surface. Therefore, the CVD-SIC material is capable of remaining sound even if the same is heated and cooled quickly.

Figure 13:
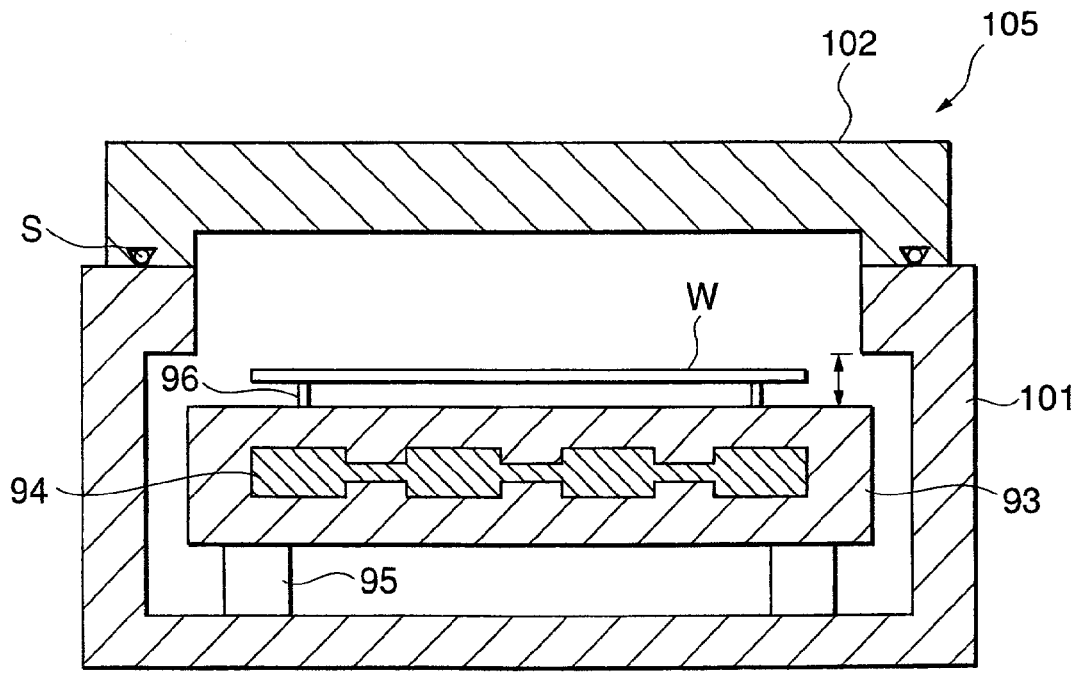
FIG. 13 is a schematic sectional view of another RTP system.

FIG. 13 shows another RTP system 105 provided with a member coated with the CVD-SiC material of the present invention in a schematic sectional view. Referring to FIG. 13, the RTP system 105 has a processing vessel 101 defining a processing chamber. The open upper end of the processing vessel 105 is covered with a lid 102. A sealing member S is held between the processing vessel 101 and the lid 102 to seal the processing chamber. Thus, the processing chamber in the processing vessel 101 can be evacuated to a vacuum by an evacuating system, not shown. A resistance-heated susceptor 98 is supported on support members 95 in the processing vessel 101 to support a wafer W thereon. A PG heater (pyrolytic graphite heater) 94 is embedded in the susceptor 93. Lifting pins 96 are supported for vertical movement on the susceptor 93. The wafer W placed on the susceptor 93 can be raised from the susceptor 93 by the lifting pins 96.

When heating a wafer by this RTP system, i.e., a heat-treatment system, the wafer W is placed on the susceptor 93 in the processing vessel 101, the processing chamber in the processing vessel 101 is sealed, the processing vessel 101 is evacuated by the evacuating system to a vacuum. Subsequently, power is supplied to the PG heater 94, the PG heater emits heat to heat the susceptor 93, whereby the wafer W is heated.

The surface of the susceptor 93 is coated with the CVD-SiC material of the present invention. As mentioned above, the CVD-SiC material of the present invention is qualitatively homogeneous and has a uniform surface. Therefore, the CVD-SiC material is capable of remaining sound even if the same is heated and cooled quickly. Since the CVD-SiC material of the present invention is thus sound and SiC has a high heat conductivity intrinsically, heat can be quickly transferred to the wafer W.

Figure 14:
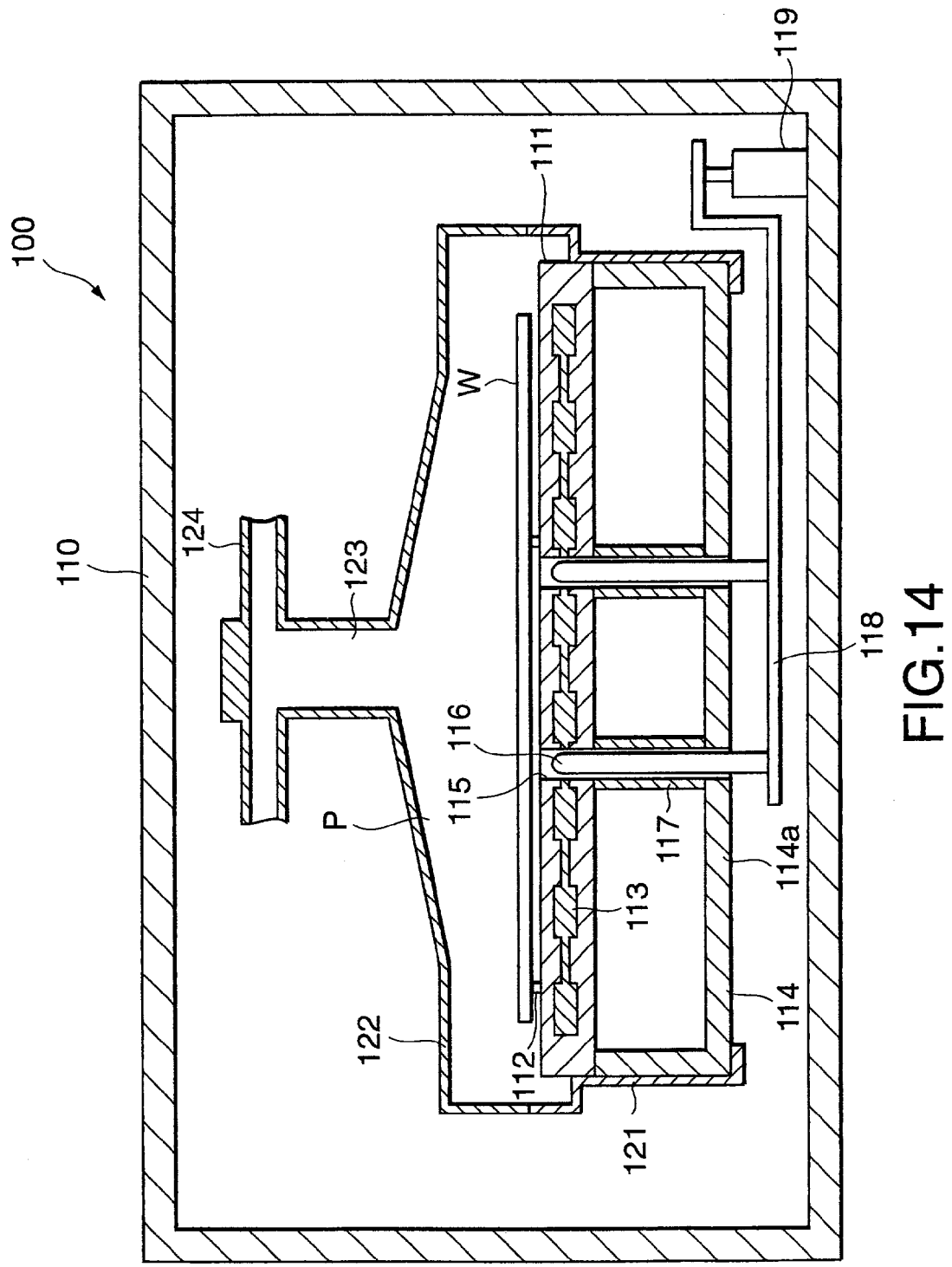
FIG. 14 is a schematic sectional view of a heating system.

The CVD-SiC material of the present invention is expected to exercise satisfactory characteristics when applied to a heating system for resist film forming and developing processes. FIG. 14 shows a heating system 100 provided with a component member coated with the CVD-SiC material of the present invention in a schematic sectional view. The heating system 100 has a casing 110 and a heating plate 111 having the shape of a disk and disposed in a lower region of a space in the casing 110. Proximity pins 112 project from the upper surface of the heating plate 111. A wafer W is supported on the proximity pins 112 close to the heating plate 111. A PG heater (pyrolytic graphite heater) 113 is embedded in the heating plate 114. The heating plate 111 is supported on a support member 114 having a cavity therein. Three through holes 115 (only two of them are shown) are formed in a central part of the heating plate 111. Three lifting pins 116 for lifting the wafer W are extended through the through holes 115 for vertical movement. Tubular guide members 117 are extended between the heating plate 111 and the bottom wall 114a of the support member 114 and are connected to the through holes 115, respectively. The tubular guide members 117 enable the lifting pins 116 to move without being obstructed by heater wiring and such arranged under the heating plate 111. The lifting pins 116 are supported on a support plate 118. The support plate 118 is moved vertically by a cylinder actuator 119 connected to one end of the support plate 118 to move the lifting pins 116 vertically. A support ring 121 is put on the support member 114 so as to surround the heating plate 111 and the support member 114. A cover 122 is joined to the open upper end of the support ring 121. The cover 122 can be vertically moved. The cover 122 is lowered and joined to the open upper end of the support ring 121 to define a heating space P in which a wafer W is subjected to a heat treatment. The cover 122 has a substantially conical shape rising from the periphery to the center. An exhaust opening 123 is formed in a central top part of the cover 122 and an exhaust duct 124 is connected the exhaust opening 123. Gases are exhausted through the exhaust opening 123 and the exhaust duct 124.

When heating a wafer W by the heating system 100, the wafer W is carried into the casing 110, the wafer W is put on the lifting pins 116 projecting upward from the heating plate 111, the lifting pins 116 are lowered to put the wafer W on the proximity pins 112, and the cover 122 is lowered. The wafer W is heated at a predetermined temperature for heat treatment, exhausting a solvent vapor from the heating space P through the exhaust opening 123 and the exhaust duct 124.

The surface of the heating plate 111 is coated with the CVD-SiC material of the present invention. As mentioned above, the CVD-SiC material is qualitatively homogeneous and has a uniform surface. Therefore, the CVD-SiC material is capable of remaining sound with respect to thermal stability even if the temperature of the heating plate 111 is changed sharply. Since the CVD-SiC material of the present invention is thus sound and SiC has a high heat conductivity intrinsically, heat can be quickly transferred from the heating plate 111 to the wafer W and the wafer W can be quickly heated to a desired temperature.

Figure 15:
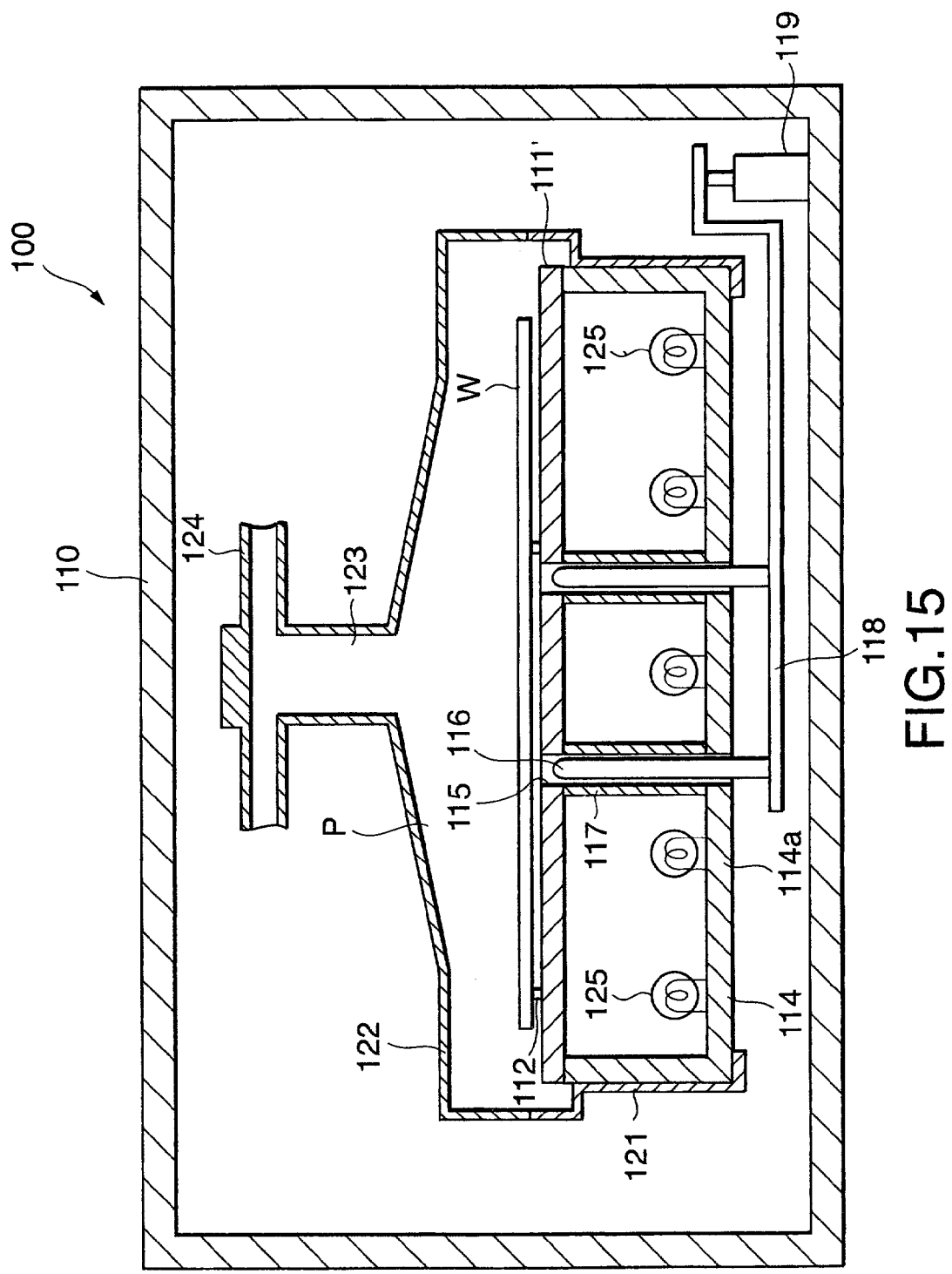
FIG. 15 is a schematic sectional view of another heating system.

Another heating system 100 shown in FIG. 15 has a heating plate 111' far thinner than the heating plate 11 of the heating system 100 shown in FIG. 14 and having a surface coated with the CVD-SiC material. Heating lamps 125 are arranged on the bottom wall of a support member 114. A wafer W supported on the heating plate 111' is heated by heat emitted by the heating lamps 125 and transferred thereto through the heating plate 111'. As mentioned above, the CVD-SiC material of the present invention is qualitatively homogeneous and has a uniform surface. Therefore, the CVD-SiC material is capable of remaining sound even if heating temperature is changed sharply. Since the CVD-SiC material of the present invention is thus sound and SiC has a high heat conductivity intrinsically, heat can be quickly transferred to the wafer W and the wafer W can be heated to a desired temperature in a short time.

The present invention is not limited in its practical application to the foregoing embodiment and various modifications are possible. For example, the CVD-SiC material of the present invention can be applied to various systems and members other than those described above. Although the application of the CVD-SiC material of the present invention to the plurality of internal component members disposed in the processing vessels of various processing systems has been described, the effect of the present invention is available when the CVD-SiC material of the present invention is applied to at least one of the component members disposed in the processing vessel. The present invention is applicable to members to be used for processing substrates other than semiconductor wafers.

EXAMPLES

The relation between R-value and etch rate when test pieces are exposed to a plasma in a plasma etching system will be described.

Samples of internal members in Examples 1 to 8 coated with the CVD-SiC material and an internal member of $Al_2O_3$ in Comparative example were prepared. The samples were subjected to the following etching experiment.

Figure 16:
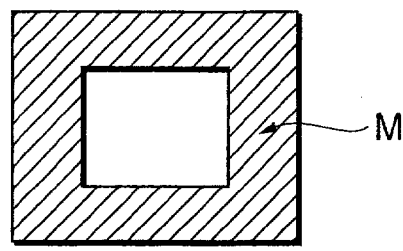
FIG. 16 a view of a specimen masked with a mask of Kapton tape.
Figure 17:
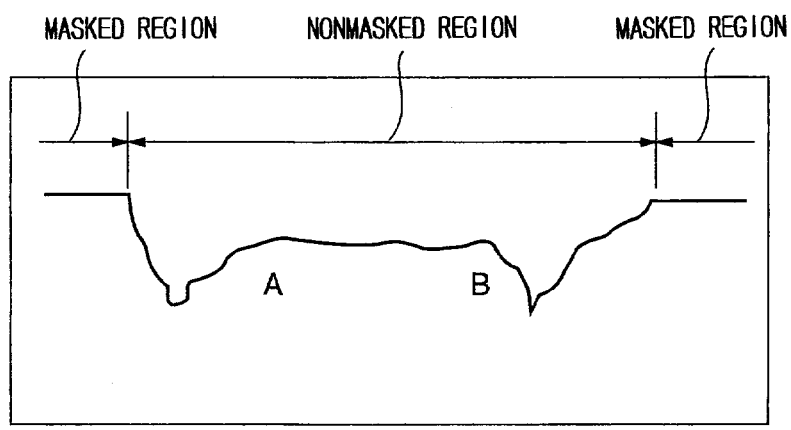
FIG. 17 is a diagram showing the change in shape of the specimen.
Figure 18:
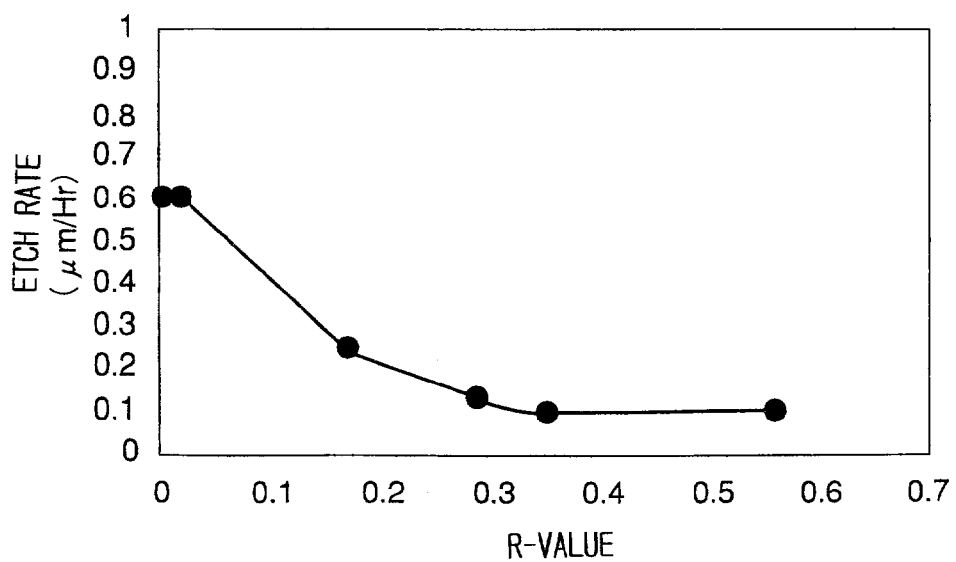
FIG. 18 is a graph showing the dependence of plasma-etch rate (μm/hr) on R-value.

(1) Conditions for Experiment
System; TE8500S ESC 8"
Time; 20 hr
n: 1 or 2
Process conditions
Power; 1300 W, Pressure: 1000 mT, $CF_4$/Ar=02/95=950 sccm/10 sccm
Size of sample: 20 Sq. mm×2 mm thickness or 30 mm diameter×2 mm thickness
Quality of sample: CVD-SiC (R=0.0004 to 0.561)
Base body: Porous SiC, graphite, CVD-SIC material.
Method of evaluation: The surface of each sample excluding a central region of 10 sq. mm was masked with a mask M of Kapton tape as shown in FIG. 16. Samples were attached to parts of a 8 inch wafer on concentric circles with a double-coated adhesive tape.
Evaluated Item: Surface Roughness
(2) Etch Rate Measuring Method
The nonmasked central region of the surface of each sample was exposed to a plasma. The respective surface roughenesses of the masked region and the nonmasked region of the surface of each sample were measured by moving a surface roughness meter from the masked region toward the nonmasked region after removing the mask of Kapton tape from the sample to obtain A and B. FIG. 17 is a diagram showing an example of measured surface roughness. It is known from FIG. 17 that the plasma is concentrated on the boundary between the mask M and the nonmasked region. A and B are only standards. FIG. 18 is a graph showing the relation between measured etch rate and R-value.

TABLE

| Samples | 1 | 2 | 3 | 4 | 5 | 6 | 7 | 8 |
|---|---|---|---|---|---|---|---|---|
| R-value | 0.004 | 0.005 | 0.02 | 0.168 | 0.17 | 0.286 | 0.349 | 0.561 |
| Etch rate (μm/min) | 0.6 | 0.6 | 0.6 | 0.25 | 0.23 | 0.13 | 0.1 | 0.1 |

The $Al_2O_3$ coating was etched at an etch rate of 0.45 μm/hr. It is known from the results of experiments that the resistance of the internal members according to the present invention to the etching action of plasma is satisfactory as compared with that of the internal member of $Al_2O_3$.

What is claimed is:

1. A CVD-SiC material formed by a CVD process and containing β-SiC crystals,
   wherein the ratio of the sum of peak intensities of x-ray diffraction for (220) and (311) planes of the β-SiC crystals to the sum of peak intensities of x-ray diffraction for (111), (200), (220), (311) and (222) planes of the β-SiC crystals is in the range between 0.15 and 0.561.

2. The CVD-SiC material according to claim 1 further containing α-SiC crystals of 6H structure.

3. The CVD-SiC material according to claim 1 or 2, wherein
   the coating is formed on a base body made of SiC, carbon or a ceramic material.

4. The CVD-SiC material according to claim 3, wherein the base body of SiC is a sintered SiC body, a β-SiC body, an α-SiC body or a CVR-SiC body (porous SiC body).

5. The CVD-SiC material according to claim 3, wherein the base body of a ceramic material has a coefficient of thermal expansion differing from that of the CVD-SiC material by the range of $\pm 2.5 \times 10^{-6}/°$ C.

6. The CVD-SiC material according to claim 4, wherein the base body of α-SiC contains α-SiC crystals of 6H structure.

7. A processing system comprising:
   a processing vessel for containing a substrate therein, and a processing mechanism for processing the substrate by a predetermined process;
   wherein each of at least some of parts placed in the processing vessel includes a base body, and a CVD-SiC material formed on the base body by CVD and containing β-SiC crystals, and
   the ratio of the sum of peak intensities of x-ray diffraction for (220) and (311) planes of the β-SiC crystals contained in the CVD-SiC material to the sum of peak intensities of x-ray diffraction for (111), (200), (220), (311) and (222) planes of the β-SiC crystals is in the range between 0.15 and 0.561.

8. A processing system comprising:
   a processing vessel for containing a substrate therein, and a processing mechanism for processing the substrate by a predetermined process;
   wherein each of at least some of parts placed in the processing vessel includes a base body, and a CVD-SiC material formed on the base body by CVD,
   the CVD-SiC material contains β-SiC crystals, and α-SiC crystals of 6H structure, and
   the ratio of the sum of peak intensities of x-ray diffraction for (220) and (311) planes of the β-SiC crystals to the sum of peak intensities of x-ray diffraction for (111), (200), (220), (311) and (222) planes of the β-SiC crystals is in the range between 0.15 and 0.561.

9. The processing system according to claim 7 or 8, wherein
   the processing mechanism includes a gas supply system, and
   the gas supply system is capable of supplying a halogen-containing gas into the processing vessel.

10. The processing system according to claim 7 or 8, wherein,
    the processing mechanism includes a gas supply system, and
    the gas supply system is capable of supplying process gases for forming a film on the substrate and of supplying a halogen-containing gas for cleaning the interior of the processing vessel after film formation, into the processing vessel.

11. The processing system according to claim 7 or 8, wherein
    the processing mechanism includes a gas supply system, and
    the gas supply system is capable of supplying an etching gas capable of etching the substrate, into the processing vessel.

12. The processing system according to claim 7 or 8, wherein
    the processing mechanism includes a gas supply system and a plasma producing system, and
    the gas supply system is capable of supplying process gases for processing the substrate into the processing vessel, and the plasma producing system is capable of producing a plasma.

13. The processing system according to claim 7 or 8, wherein
    the processing system is a LPCVD system, a RTP system, an epitaxial CVD system, an etching system or a coating system.

14. The processing system according to claim 7, wherein the CVD-SiC material contains α-SiC crystals of 6H structure.

15. The processing system according to claim 7 or 8, wherein
    the CVD-SiC material is formed on a base body of SiC, carbon or a ceramic material.

16. The processing system according to claim 15, wherein the base body of SiC is a sintered SiC body, a β-SiC body, an α-SiC body or a CVR-SiC body (porous SiC body).

17. The processing system according to claim 15, wherein the base body of a ceramic material has a coefficient of thermal expansion differing from that of the CVD-SiC material by the range of $\pm 2.5 \times 10^{-6}/°$ C.

18. The processing system according to claim 16, wherein the base body of α-SiC contains α-SiC crystals of 6H structure.

19. A CVD-SiC material forming method of forming a CVD-SiC material on a base body by a CVD process, said CVD-SiC material forming method comprising the steps of:
    placing the base body in a processing vessel; and
    depositing a CVD-SiC material containing β-SiC crystals on the base body by supplying a mixed gas containing a Si-containing gas and a carbon-containing gas into the processing vessel in an evacuated condition, and heating the base body;
    wherein the ratio of the sum of peak intensities of x-ray diffraction for (220) and (311) planes of the β-SiC crystals to the sum of peak intensities of x-ray diffraction for (111), (200), (220), (311) and (222) planes of the β-SiC crystals is in the range between 0.15 and 0.561.

20. A CVD-SiC material forming method of forming a CVD-SiC material on a base body by a CVD process, said CVD-SiC material forming method comprising the steps of:
    placing the base body in a processing vessel; and
    depositing a CVD-SiC material on the base body by supplying a mixed gas containing a Si-containing gas and a carbon-containing gas into the processing vessel in an evacuated condition, and heating the base body;
    wherein the CVD-SiC material contains β-SiC crystals, and α-SiC crystals of 6H structure and
    the ratio of the sum of peak intensities of x-ray diffraction for (220) and (311) planes of the β-SiC crystals to the sum of peak intensities of x-ray diffraction for (111) (200), (220), (311) and (222) planes of the β-SiC crystals is in the range between 0.15 and 0.561.

21. The CVD-SiC material forming method according to claim 19 or 20 wherein
    the Si-containing gas is $SiCl_4$ gas, and the carbon-containing gas is $C_3H_8$ gas.

22. The CVD-SiC material forming method according to claim 19 or 20, wherein
    the base body is heated at 1400° C. or above.

* * * * *